United States Patent
Appelt et al.

(10) Patent No.: US 6,781,064 B1
(45) Date of Patent: Aug. 24, 2004

(54) PRINTED CIRCUIT BOARDS FOR ELECTRONIC DEVICE PACKAGES HAVING GLASS FREE NON-CONDUCTIVE LAYERS AND METHOD OF FORMING SAME

(75) Inventors: Bernd K. Appelt, Endicott, NY (US); Anilkumar C. Bhatt, Johnson City, NY (US); James W. Fuller, Jr., Endicott, NY (US); John M. Lauffer, Waverly, NY (US); Voya R. Markovich, Endwell, NY (US); William J. Rudik, Vestal, NY (US); William E. Wilson, Waverly, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/342,584

(22) Filed: Jun. 29, 1999

Related U.S. Application Data

(63) Continuation-in-part of application No. 08/699,902, filed on Aug. 20, 1996.

(51) Int. Cl.[7] .............................................. H05K 1/03
(52) U.S. Cl. .................. 174/256; 174/255; 174/266; 361/795
(58) Field of Search .................. 174/255, 261–266, 174/256; 361/780, 792–795

(56) References Cited

U.S. PATENT DOCUMENTS

| | | |
|---|---|---|
| 3,777,220 A | 12/1973 | Tatusko et al. |
| 4,191,800 A | 3/1980 | Holtzman |
| 4,404,059 A | 9/1983 | Livshits et al. |
| 4,511,757 A * | 4/1985 | Ors et al. .................. 174/258 |
| 4,521,262 A * | 6/1985 | Pellegrino .................. 156/150 |
| 4,631,100 A * | 12/1986 | Pellegrino .................. 156/150 |
| 4,769,270 A | 9/1988 | Nagamatsu et al. |
| 4,868,350 A * | 9/1989 | Hoffarth et al. ............. 174/266 |
| 4,888,247 A * | 12/1989 | Zweben et al. ............. 428/105 |
| 4,888,450 A * | 12/1989 | Lando et al. ............... 174/256 |
| 4,925,525 A | 5/1990 | Oku et al. |
| 4,980,217 A | 12/1990 | Grundfest et al. |
| 5,004,639 A | 4/1991 | Desai |
| 5,026,624 A * | 6/1991 | Day et al. ................ 430/280.1 |

(List continued on next page.)

OTHER PUBLICATIONS

"Chapter 12: Printed Circuit Board Packaging," *Microelectronics Packaging Handbook*, Tummala, Rao R., et al., Editors, and Klopfenstein, Alan G., Managing Editor, Van Nostrand Reinhold (New York) 1989, pp. 863–921.
"Electrochemical Migragion in Multichip Modules," Rudra. B., et al., *Circuit World*, vol. 22, No. 1, 1995, pp. 67–70.
"Microstructure of Conductive Anodic Filaments Formed during Accelerated Testing of Printed Wiring Boards," Ready, W. J., et al., *Circuit World*, vol. 21, No. 4, 1995, pp. 5–9.

Primary Examiner—Kamand Coneo
Assistant Examiner—Jose H. Alcala
(74) Attorney, Agent, or Firm—RatnerPrestia; William Steinberg, Esq.

(57) ABSTRACT

A printed circuit board for use in an electronic device package such as a ball grid array package or organic chip carrier package. This printed circuit board includes a glass-free dielectric for separating and insulating power cores, circuitry or plated through holes from each other to prevent shorts caused by a migration of conductive material along glass-based prepreg substrates.

25 Claims, 3 Drawing Sheets

U.S. PATENT DOCUMENTS

| | | |
|---|---|---|
| 5,050,038 A | 9/1991 | Malaurie et al. |
| 5,114,518 A | 5/1992 | Hoffarth et al. |
| 5,252,195 A | 10/1993 | Kobayashi et al. |
| 5,277,787 A | 1/1994 | Otani et al. |
| 5,288,542 A | 2/1994 | Cibulsky et al. |
| 5,374,788 A * | 12/1994 | Endoh et al. ............... 174/255 |
| 5,418,689 A | 5/1995 | Alpaugh et al. |
| 5,451,721 A * | 9/1995 | Tsukada et al. ............. 174/261 |
| 5,468,999 A | 11/1995 | Lin et al. |
| 5,485,038 A | 1/1996 | Licari et al. |
| 5,500,555 A | 3/1996 | Ley |
| 5,521,332 A | 5/1996 | Shikata et al. |
| 5,590,030 A | 12/1996 | Kametani et al. |
| 5,598,031 A | 1/1997 | Groover et al. |
| 5,625,225 A | 4/1997 | Huang et al. |
| 5,763,060 A * | 6/1998 | Kerrick ....................... 174/255 |
| 5,827,604 A * | 10/1998 | Uno et al. ................... 428/209 |
| 5,837,155 A * | 11/1998 | Inagaki et al. ................ 216/18 |
| 5,949,030 A * | 9/1999 | Fasano et al. ............. 174/262 |
| 5,981,880 A * | 11/1999 | Appelt et al. ............... 174/258 |
| 5,994,771 A * | 11/1999 | Sasaki et al. ............... 257/700 |
| 6,323,439 B1 * | 11/2001 | Kambe et al. .............. 174/255 |
| 6,400,010 B1 * | 6/2002 | Murata ....................... 257/706 |

* cited by examiner

PRINTED CIRCUIT BOARDS FOR ELECTRONIC DEVICE PACKAGES HAVING GLASS FREE NON-CONDUCTIVE LAYERS AND METHOD OF FORMING SAME

CROSS REFERENCE TO RELATED APPLICATIONS

The present application is a continuation-in-part of U.S. patent application Ser. No. 08/699,902, filed on Aug. 20, 1996, which is pending and is assigned to the assignee of the subject application.

TECHNICAL FIELD OF THE INVENTION

This invention relates to printed circuit boards for electronic device packages such as ball grid array packages or organic chip carrier packages.

BACKGROUND OF THE INVENTION

Printed circuit or wiring boards are currently used in electronic device packages, multichip modules, or organic chip carrier packages wherein the electronic device, such as integrated circuit chip(s) or memory chip(s), are directly attached to the printed circuit board. Such an electronic device package is necessary due to the large number of input/output contacts of the electronic device. The electronic device package is typically used to electrically couple the electronic device to an external printed circuit board. An example of such an electronic device package is a ball grid array package or organic chip carrier package such as found in U.S. Pat. No. 5,355,283. Previously, such packages were based on ceramic or multi-layer ceramic packages. For electrical performance, cost, and other reasons, the packages are being converted to printed circuit board based packages.

FIG. 1 is a cross-sectional view of a prior art ball grid array package 10. An integrated circuit chip or electronic device 12 is attached to a prepreg-based substrate 14 comprising glass cloth or fabrics impregnated with epoxy resin, sometimes referred to as sticker sheets or prepreg. Electrically conductive bond wires 16 make electrical connection between selected one of contacts (not shown) formed on the electronic device 12 and electrically conductive circuitry 18 formed on top surface 20 of the substrate 14. Encapsulant 22 is formed on top surface 20 of substrate 14 to cover electronic device 12, bond wires 16, and a portion of circuitry 18. Circuitry 18 extends beyond encapsulant 22 to through holes 24 that are formed through substrate 14 to bottom surface 26 of substrate 14. Through holes 24 are plated with electrically conductive material and thus are often referred to as plated through holes. Electrically conductive traces 28 formed on the bottom surface 26 of substrate 14 extend from through holes 24 to pads 30 on which solder balls 32 are formed. In the conventional ball grid array 10, electrical connection between circuitry 18 on top surface 20 and traces 28 on bottom surface 26 of substrate 14 is made by through holes 24. Although not shown, substrate 14 may also include one or more internal circuit planes embedded therein. These planes may serve as signal, power, voltage, or ground planes and are usually incorporated in pairs. Such subcomposites are often called cores.

It is to be noted that substrate 14, circuitry 18, plated through holes 24, traces 28, and pads 30 form a printed circuit board (PCB) 33. Printed circuit boards are sometimes referred to as printed wiring boards (PWBs). Electronic device packages using printed circuit boards having glass-based prepreg substrates are prone to failures caused by shorts between circuitry 18 located on top surface 20, traces 28 located on bottom surface 26, or between power cores and the electrical traces 28 or circuitry 18 or between two power cores (not shown in FIG. 1) or between a power core and a plated through hole or between a plated through hole and traces 28 or circuitry 18.

In particular, shorts due to electrochemical migration are known to occur and are described as cathodic anodic filaments (CAF). The formation of CAFs is described in detail in B. Rudra, M. J. Li, M. Pecht, and D. Tennings, "Electrochemical Migration in Multichip Modules," *Circuit World*, Vol. 22, No. 1, pp. 67–70 (1995), and in W. J. Ready, S. R. Stock, G. B. Freeman, L. L. Dollar, and L. J. Turbini, "Microstructure of Conductive Anodic Filaments Formed During Accelerated Testing of Printed Wiring Boards," *Circuit World*, Vol. 21, No. 4, pp. 5–9 (1995). JEDEC module test requirements, such as a highly accelerated stress test (HAST) using 130° C., 85% relative humidity, bias, 100 hours, and temperature humidity bias test (THB) using 85° C., 85% relative humidity, bias, 1000 hours, are likely to develop such shorts in laminate chip carriers. These test conditions are orders of magnitude more severe than conventional IPC insulation resistance tests (50° C., 80% relative humidity, bias, 300 hours). The IPC test requirements are fulfilled by these organic chip carrier packages easily.

Referring to FIG. 2, such shorting failures are illustrated wherein reference numerals which are like or similar to the reference numerals in FIG. 1 indicate like or similar parts. FIG. 2 illustrates a portion of a printed circuit board 33 for use in an electronic device package 10. Printed circuit board 33 includes power planes 34, 36 embedded within substrate 14. Substrate 14 includes sticker sheets containing glass fibers 38, 40, 42 as shown schematically. Conductive material in circuitry 18, plated through hole 24, or power planes 34, 36 migrate along the glass fibers contained within prepreg 38, 40, 42 to form conductive filaments 44, 46, 48 along the glass fibers. Filaments 44 create a conductive path or short between circuitry 18a and circuitry 18b. As spacing 50 between circuitry 18a and 18b decreases, the likelihood of such shorts increases. Filaments 46, in the sticker sheets on the inside of the core, create a short between power plane 34 and plated through hole 24 such as by bridging the clearance hole between the power plane 34 and plated through hole 24. Filaments 48 in the prepreg outside the core create a short between power plane 36 and plated through hole 24 such as by bridging the clearance hole between power plane 36 and plated through hole 24. It will be appreciated that other shorting conditions can be caused by other CAFs formed within substrate 14. What is needed is a printed circuit board design for use in an electronic device package which eliminates short failures caused by plating of conductive material or migration along glass fibers contained within the printed circuit board.

SUMMARY OF THE INVENTION

Accordingly, the present invention is directed to a printed circuit board for use in an electronic device package comprising a substrate layer comprising impregnated glass fibers; a non-conductive layer comprising a glass-free or non-continuous glass-fibers dielectric material laminated to the substrate layer and a electrically conductive circuitry comprising a conductive material formed on the non-conductive layer such that the non-conductive layer lies between the substrate layer and the conductive material to prevent shorts therebetween caused by migration of the conductive material along continuous glass fibers.

The present invention is also directed to an electronic device package comprising at least one substrate wherein the substrate comprises impregnated glass fibers; an electronic device coupled to the substrate; a non-conductive layer comprising a glass-free dielectric material laminated to each substrate and an electrically conductive circuitry comprising a conductive material formed on the nonconductive layers or the substrates such that each non-conductive layer lies between each substrate and conductive material to prevent shorts therebetween caused by electrochemical migration of the conductive material along the glass fibers.

The present invention is also directed to an electronic device package comprising at least one substrate wherein each substrate comprises impregnated glass fibers; at least one plated through hole extending through each substrate; at least one conductive power core; an electronic device coupled to at least one of the substrates and a non-conductive layer comprising a glass-free dielectric material positioned between each plated through hole and each power core to prevent a short therebetween caused by electrochemical migration of conductive material along the glass fibers.

The present invention is also directed to an electronic device package comprising a non-conductive substrate comprising a glass-free dielectric material; an electronic device coupled to the substrate and electrically conductive circuitry comprising a conductive material formed on the substrate wherein the electronic device is electrically coupled to the circuitry.

The primary advantage of the present invention is the elimination of CAF shorts in all printed circuit boards, including printed circuit boards used in electronic device packages.

DETAILED DESCRIPTION OF A PREFERRED EMBODIMENT OF THE INVENTION

Figure 1:
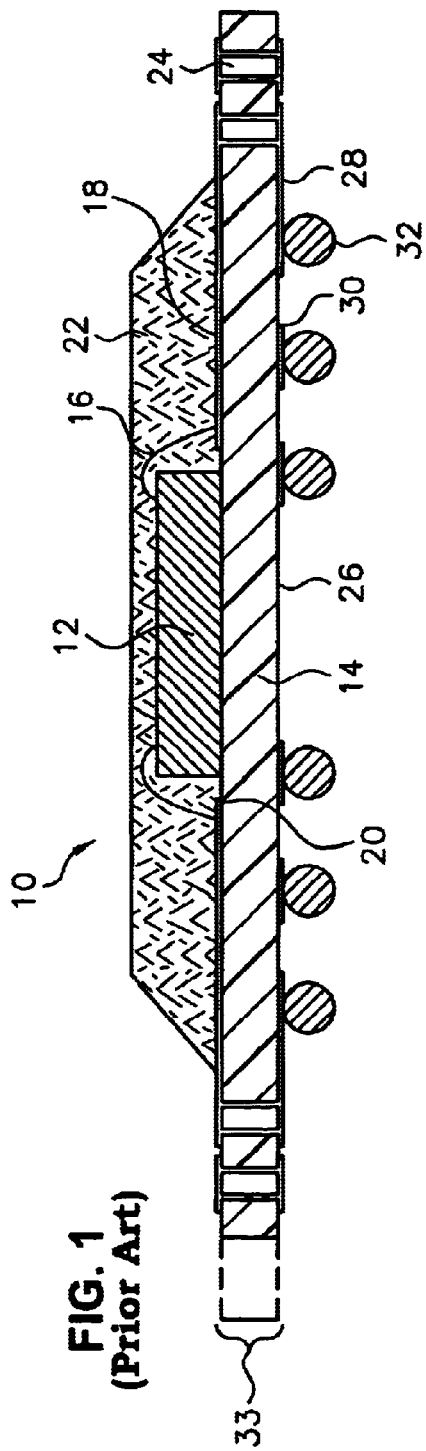
FIG. 1 is a cross-sectional view of a prior art electronic device package.
Figure 3:
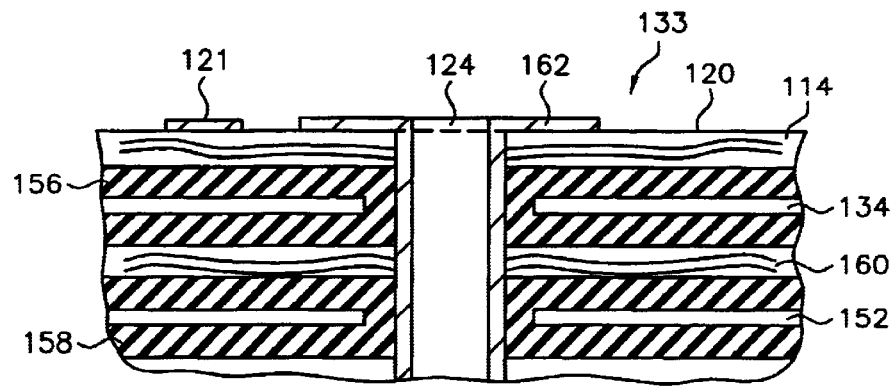
FIG. 3 is a partial cross-sectional view of a printed circuit board for use in electronic device package according to the present invention.
Figure 4:
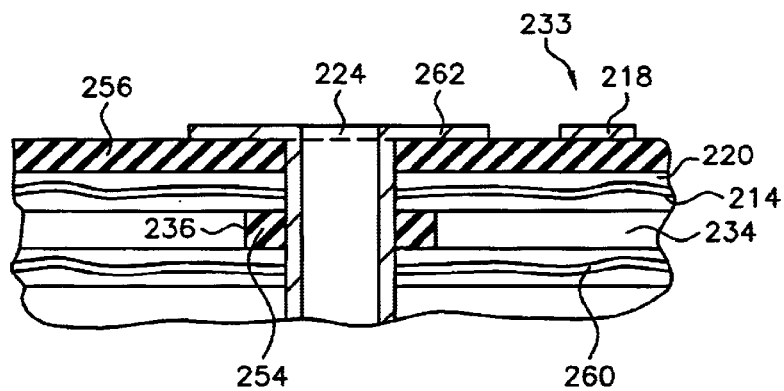
FIG. 4 is an alternative embodiment of a printed circuit board for use in an electronic device package according to the present invention.
Figure 5:
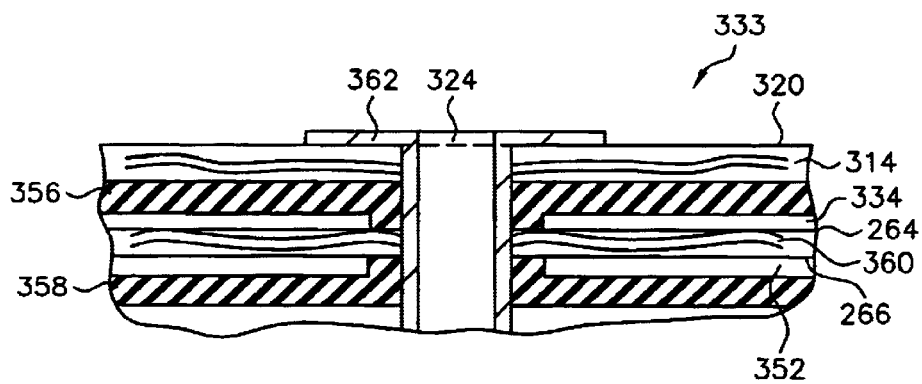
FIG. 5 is a second alternative embodiment of a printed circuit board for use in electronic device package according to the present invention.

FIGS. 3–5 illustrate various printed circuit boards for use in an electronic device package such as described in FIG. 1. It will be appreciated that the printed circuit boards shown in FIGS. 3–5 can be used in any electronic device package wherein an electronic device such as an integrated circuit chip, a memory chip or the like, is directly attached to the printed circuit board or to a cavity within a printed circuit board.

Figure 2:
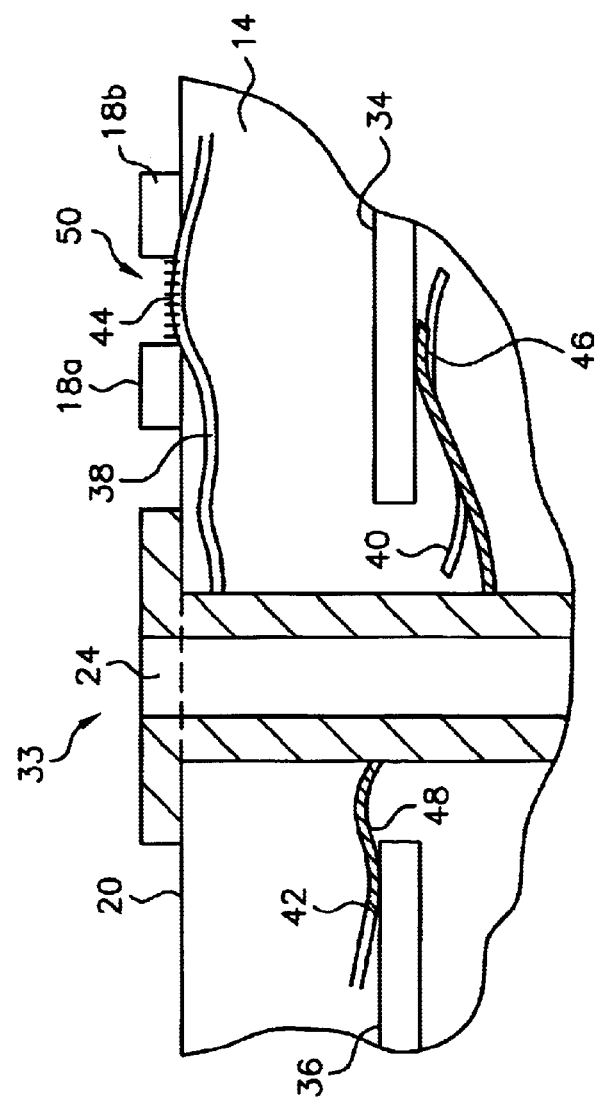
FIG. 2 is a partial cross-sectional view of a prior art printed circuit board for use in an electronic device package illustrating shorts caused by electrochemical migration of conductive material along glass fibers.

Referring to FIG. 3, wherein reference numerals which are like or similar to the reference numerals used in FIGS. 1 and 2 are intended to indicate like or similar parts, a printed circuit board 133 for use in an electronic package is shown. Printed circuit board 133 includes a first substrate layer 114 comprised of impregnated glass fibers. Preferably, first substrate layer 114 is a prepreg or sticker sheet comprising glass fabric impregnated with epoxy resin. Typically, a thin film of epoxy resin (e.g. 0.1 mil to 0.5 mil) is developed at the surface of substrate layer 114 as part of the step of impregnation of the substrate layer with the epoxy resin. Printed circuit board 133 includes power planes 134, 152. Power planes 134, 152 are preferably constructed from copper foil sheets but may be constructed from other conductive materials. Power planes 134, 152 are completely encapsulated within non-conductive layers 156, 158. This subassembly is also referred to as a power core. Non-conductive layers 156, 158 are comprised of a dielectric material free of continuous glass fibers. In the preferred embodiment, non-conductive layers 156, 158 comprise glass-free dielectric material such as photoimageable dielectric, PID, described in U.S. Pat. No. 5,026,624 and U.S. Pat. No. 5,300,402 (these patents are hereby incorporated by reference), which can be applied as a liquid or a dry film. Here, no use is made of the photoimageable properties. However, other materials, such as soldermasks, other photoimageable dielectrics, epoxy coatings, polyimide-based coatings, cyanate ester-based coatings, bismaleimide triazin-based coatings can be used. Another set of usable materials is based on impregnated papers derived from kevlar fibers, e.g., DuPont Company's "Thermount." A second substrate or prepreg 160 comprising glass fibers impregnated with epoxy resin is positioned between non-conductive layers 156 and 158 and is laminated thereto. Additionally, first substrate or pre-peg 114 is laminated to non-conductive layer 156. These lamination steps may be performed in one step or sequentially. Non-conductive layers 156 and 160 are separate from the substrate layers and are deposited over any thin films of epoxy resin which are formed as part of the step of impregnation of the substrate layers with epoxy resin. As such, non-conductive layers 156 and 160 are not reinforced as are the substrate layers that are impregnated (i.e. non-conductive layers 156 and 160 are free of continuous glass fibers). Typically, the thickness of non-conductive layers 156 and 160 is between 0.5 mils and 5 mils.

Print circuit board 133 includes one or more plated through holes 124. The process of making plated through holes and circuitry is well known and not described here. Non-conductive layers 156, 158 insulate power planes 134, 152 from each other and from plated through hole 124 and from the glass fibers contained within substrates 114, 160. In this manner, shorts caused by electrochemical migration of conductive material between power planes 134, 152 and plated through hole 124 along glass fibers contained within substrates 114, 160, as described in connection with FIG. 2, can be eliminated. Plated through hole 124 includes a conductive pad 162 formed on a first surface 120 of substrate 114. It will be appreciated that other electrically conductive circuitry 121 may be formed on surface 120.

Referring now to FIG. 4, wherein like reference numerals indicate like or similar components, a non-conductive layer 256 comprising a dielectric material free of continuous glass fibers, such as the glass-free dielectric as described above, is laminated to first surface 220 of substrate 214. A power plane 234 is disposed below substrate 214 and a second substrate 260 is disposed below power plane 234. Conductive pad 262 of plated through hole 224 is formed on top of non-conductive layer 256. Additionally electrically conductive circuitry 218 is formed on top of non-conductive layer 256. Circuitry 218 may include trace lines, pads or the like. In this manner, non-conductive layer 256 prevents glass fibers contained in substrate 214 from causing shorts between trace lines or between circuitry 218 and pad 262 or between other circuitry contained within electrically conductive circuitry 218. In addition to the previously cited materials, resin coated copper foils, such as Allied Signal Companies' "RCC" material, may be used to form layer 256 and the circuitry 262 and 218.

Still referring to FIG. 4, printed circuit board 233 includes clearances 236 which isolate the power plane 234 from certain plated through holes 224 or discontinue the power plane 234 between functional elements (not shown here). Under conventional lamination, clearances 236 are filled with resin from the sticker sheets, resulting in resin depletion from the glass cloth and hence increase the propensity of the glass fibers contacting the power plane. This condition, illustrated in FIG. 2, again can facilitate CAF shorts as shown. Here, then, clearances 236 are filled with a non-conductive, dielectric material 254 free of continuous glass fibers, as previously listed. The coating is cured, and the core is laminated with conventional prepreg 214. The filled clearances 236 now avoid resin depletion, avoid deflection of glass fibers into clearance 236, and maintain an insulating layer of resin between the conductive layer 234 and the glass fibers of prepreg 214 and the plated through hole 224.

Referring now to FIG. 5 wherein like reference numerals indicate like or similar components, non-conductive layers 356, 358 only partially encapsulate power planes 334 and 352 such that power planes 334 and 352 are formed on or about second substrate 360. In other words, power plane 334 lies on a first surface 264 of substrate 360, and power plane 352 lies on a second surface 266 of substrate 360. Whereas in the printed circuit board 133 of FIG. 3, power planes 134, 152 are completely encapsulated within non-conductive layers 156, 158, and layers 156, 158 are, in turn, laminated to second substrate 160.

Figure 6:
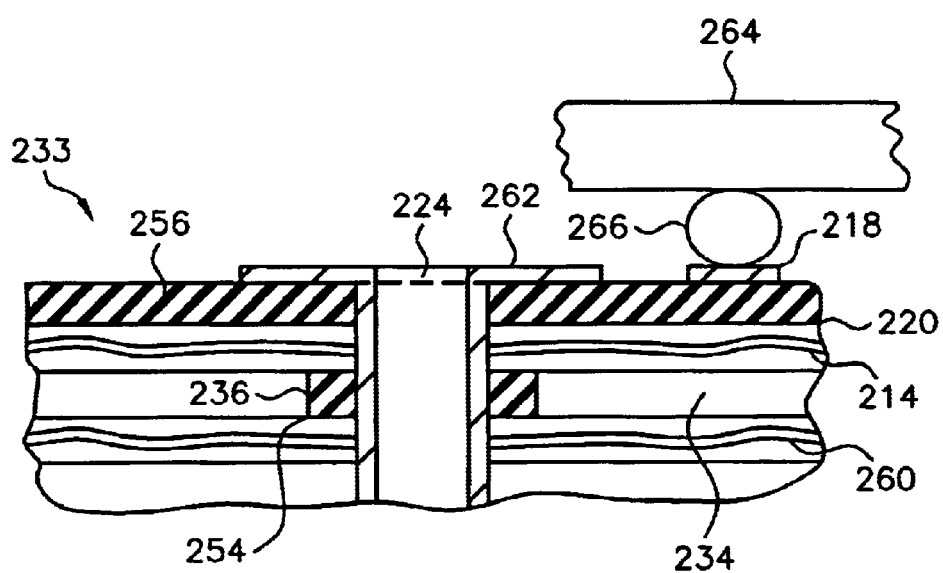
FIG. 6, generally similar to FIG. 4, shows an electronic device coupled to the printed circuit board.

Referring to FIG. 6, which is generally similar to FIG. 4, an electronic device component, represented by reference numeral 264, is coupled to non-conductive layer 256 by, for example, a solder ball 266 disposed between the electronic device component and electrically conductive circuitry 218. FIG. 6 represents the many types of electronic device components that can be coupled to the substrate and the many ways to couple such electronic device components to the substrate.

Method of the Manufacture

The preferred methods of manufacturing a printed circuit board 133, 233, 333 for use in an electronic device package, such as electronic device package 10, according to the invention will now be described. The manufacturing of printed circuit boards 133, 233, 333 utilizes well-known methods as described in Chapter 12 of *Microelectronics Packaging Handbook*, Van Nostrand Reinhold, 1989, pp. 863–921. The manufacture of printed circuit board 133 will first be described.

In a first step, a subcomposite is laminated together comprised of conductive layer 152, non-conductive layer 158 of PID, substrate 160, non-conductive layer 156 of PID, and conductive layer 134. Using well known photolithographic techniques, clearances for some of the plated through holes are etched into conductive layers 134, 152. In a subsequent step, a composite is laid up and laminated comprised of a conductive sheet (not shown), one or more sticker sheets 114, non-conductive layer 158, the previously circuitized subcomposite or core, non-conductive layer 156, one or more sticker sheets 114, and another layer of conductive material. This fills the clearances with non-conductive material 156, 158 of PID and thereby completes the insulation of the conductive layers 134, 152. Next, through holes are drilled and plated with conductive material using well known processes. Further, using well known photolithographic processes, the external circuit patterns such as 162 are formed.

In the manufacture of printed circuit board 233, a circuitized core comprising two conductive layers 234 and one or more sheets of prepreg 260 is laid up on either side with non-conductive layer of PID 256 and conductive layer 262 and laminated into a composite. The composite is finished as above by drilling, plating, and circuitizing. Clearances 236 in a circuitized core are filled with a liquid dielectric 254 using a squeegee and B-stage cured in an oven. The core is subsequently oxidized using well known techniques and laid up with sticker sheets 214 and conductive layers 262 into a composite. Subsequently, through holes are formed, plated, and the external circuit pattern is formed using well known techniques. Non-conductive layer 256 may be omitted in this construction. In an alternative manufacture of printed circuit board 233, a previously circuitized core comprised of conductive layer 234 and prepreg 260, is laid up with sticker sheets 214, non-conductive layer of PID 256, and a conductive sheet to form a laminate. Through holes and circuitry are again formed using well known techniques. If desirable, sticker sheets 214 may be omitted.

In the manufacture of printed circuit board 333, a circuitized power core comprising conductive layers 334, 352, one or more sheets of prepreg 360, is coated with non-conductive layers 356, 358 of PID. In a next step, this assembly is laid up with one or more sticker sheets 314 and conductive layer 362 on either side and laminated into a composite. Plated through hole and circuitization are formed using well known methods.

It is understood that the number of cores or conductive planes can be varied as required by electrical design using the methodologies described. It is further understood that the various elements of the disclosure can be combined such that reliability and cost can be optimized for the desired performance level.

Although the present invention and its advantages have been described in detail, it should be understood that various changes, substitutions and alterations can be made herein without departing from the spirit or scope of the invention as defined in the appended claims.

What is claimed is:

1. A printed circuit board for use in an electronic device package comprising:
    a substrate layer comprising impregnated glass fibers;
    a non-conductive layer comprising a dielectric material free of continuous glass fibers applied to said substrate layer; and
    an electrically conductive circuitry comprising a conductive material, said electrically conductive circuitry encapsulated by said non-conductive layer such that said electrically conductive circuit is without contact to said substrate layer and said non-conductive layer lies between said substrate layer and said electrically conductive circuitry to prevent shorts therebetween caused by migration of said conductive material along said glass fibers.

2. The printed circuit board as recited in claim 1 further comprising a plated through hole extending through said substrate layer and said non-conductive layer and electrically coupled to said circuitry.

3. The printed circuit board as recited in claim 1 wherein said dielectric material comprises a photoimageable dielectric material.

4. The printed circuit board as recited in claim 1 wherein said dielectric material comprises polyimide.

5. The printed circuit board as recited in claim 1 wherein said dielectric material comprises Kevlar-based paper impregnated with epoxy resin.

6. The printed circuit board as recited in claim 1 wherein said dielectric material is resin-coated copper foil.

7. The printed circuit board as recited in claim 1 wherein said substrate layer is prepreg comprising a glass fabric impregnated with epoxy resin.

8. The printed circuit board as recited in claim 2, further comprising at least one clearance between said electrically conductive circuitry and said plated through hole filled with said dielectric material.

9. A printed circuit board as recited in claim 1 wherein the thickness of said non-conductive layer is between 0.5 mils and 5 mils.

10. An electronic device package comprising:
a substrate comprising impregnated glass fibers;
an electrically conductive circuit; and
a non-conductive layer comprising a dielectric material free of continuous glass fibers applied to said substrate such that said non-conductive layer encapsulates said electrically conductive circuit so that said electrically conductive circuit is without contact to said substrate and said non-conductive layer lies between said substrate and said electrically conductive circuit to prevent shorts there between caused by migration of said electrically conductive circuit along said glass fibers.

11. The electronic device package as recited in claim 10 further comprising at least one power plane.

12. The electronic device package as recited in claim 10 further including a second substrate comprising impregnated glass fibers, a power plane and a second non-conductive layer positioned between said second substrate and said power plane.

13. The electronic device package as recited in claim 11 further comprising at least one plated through hole extending through said substrate and said non-conductive layer.

14. The electronic device package as recited in claim 13 wherein said power plane is spaced from said through hole and said electronic device package further includes a non-conductive layer comprising a dielectric material free of continuous glass fibers in the space between said power plane and said through hole to prevent a short there between.

15. The electronic device package as recited in claim 13 wherein said non-conductive layer is positioned between said through hole and said electrically conductive circuit.

16. The electronic device package as recited in claim 10 further comprising at least one clearance filled with said dielectric material.

17. The electronic device package as recited in claim 10 further including an electronic device electrically coupled to said electrically conductive circuit.

18. The electronic device package as recited in claim 10 wherein said electrically conductive circuit includes a plurality of solder pads.

19. The electronic device package as recited in claim 18 further comprising a solder ball coupled to one of said solder pads.

20. The electronic device package as recited in claim 10 wherein said dielectric material comprises a photoimageable dielectric material.

21. The electronic device package as recited in claim 10 wherein said dielectric material comprises polyimide.

22. The electronic device package as recited in claim 10 wherein said dielectric material comprises Kevlar-based paper impregnated with epoxy resin.

23. The electronic device package as recited in claim 10 wherein said dielectric material comprises resin-coated copper foil.

24. The electronic package device as recited in claim 10 wherein said substrate layer is prepreg comprising glass fabric impregnated with epoxy resin.

25. An electronic device package as recited in claim 10 wherein the thickness of said non-conductive layer is between 0.5 mils and 5 mils.

* * * * *